United States Patent
Kim et al.

(10) Patent No.: US 9,768,583 B2
(45) Date of Patent: Sep. 19, 2017

(54) MULTI-CHANNEL OPTICAL MODULE AND MANUFACTURE METHOD THEREOF

(71) Applicant: ELECTRONICS AND TELECOMMUNICATIONS RESEARCH INSTITUTE, Daejeon (KR)

(72) Inventors: Jeong Eun Kim, Gwangju (KR); Hyun Seo Kang, Gwangju (KR); Keo Sik Kim, Gwangju (KR); Ji Hyoung Ryu, Jeonju-si (KR); Hyoung Jun Park, Gwangju (KR); Kwon Seob Lim, Gwangju (KR); Young Soon Heo, Gwangju (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 15/209,902

(22) Filed: Jul. 14, 2016

(65) Prior Publication Data

US 2017/0125972 A1 May 4, 2017

(30) Foreign Application Priority Data

Nov. 4, 2015 (KR) ........................ 10-2015-0154514

(51) Int. Cl.
*H01S 5/022* (2006.01)
*H01S 5/024* (2006.01)
*H01S 5/40* (2006.01)

(52) U.S. Cl.
CPC ........ *H01S 5/02212* (2013.01); *H01S 5/0224* (2013.01); *H01S 5/02256* (2013.01); *H01S 5/02284* (2013.01); *H01S 5/02288* (2013.01); *H01S 5/02415* (2013.01); *H01S 5/4087* (2013.01)

(58) Field of Classification Search
None
See application file for complete search history.

(56) References Cited

U.S. PATENT DOCUMENTS 8,355,612 B2   1/2013   Kang et al.
8,879,601 B1   11/2014  Lee
(Continued)

FOREIGN PATENT DOCUMENTS

KR  10-2010-0031895   3/2010
KR  10-1047121        7/2011
(Continued)

*Primary Examiner* — Armando Rodriguez
(74) *Attorney, Agent, or Firm* — Kile Park Reed & Houtteman PLLC

(57) ABSTRACT

Provided herein is a multi-channel optical module including a plurality of laser diodes emitting light with different wavelengths, a thermoelectric cooling device including the plurality of laser diodes, a TO-can including the thermoelectric cooling device, and a holder combined with the TO-can and including a plurality of optical lenses focusing the light with different wavelengths and a multiplexer gathering focused light into a single optical fiber, wherein the holder has a shape in which the TO-can is cut along an axis of a path of the light with different wavelengths for active alignment of the plurality of optical lenses.

19 Claims, 5 Drawing Sheets

(56) References Cited

U.S. PATENT DOCUMENTS

| | | | |
|---|---|---|---|
| 2006/0165353 A1* | 7/2006 | Miao | G02B 6/4246 385/88 |
| 2010/0067848 A1 | 3/2010 | Hwang et al. | |
| 2012/0263917 A1 | 10/2012 | Kang et al. | |
| 2013/0021581 A1* | 1/2013 | Takahashi | H01S 5/02292 353/31 |
| 2014/0328595 A1 | 11/2014 | Han et al. | |

FOREIGN PATENT DOCUMENTS

| KR | 10-2012-0016033 | 2/2012 |
|---|---|---|
| KR | 10-2012-0056480 | 6/2012 |
| KR | 10-1175300 | 8/2012 |
| KR | 10-2015-0026803 | 3/2015 |

* cited by examiner

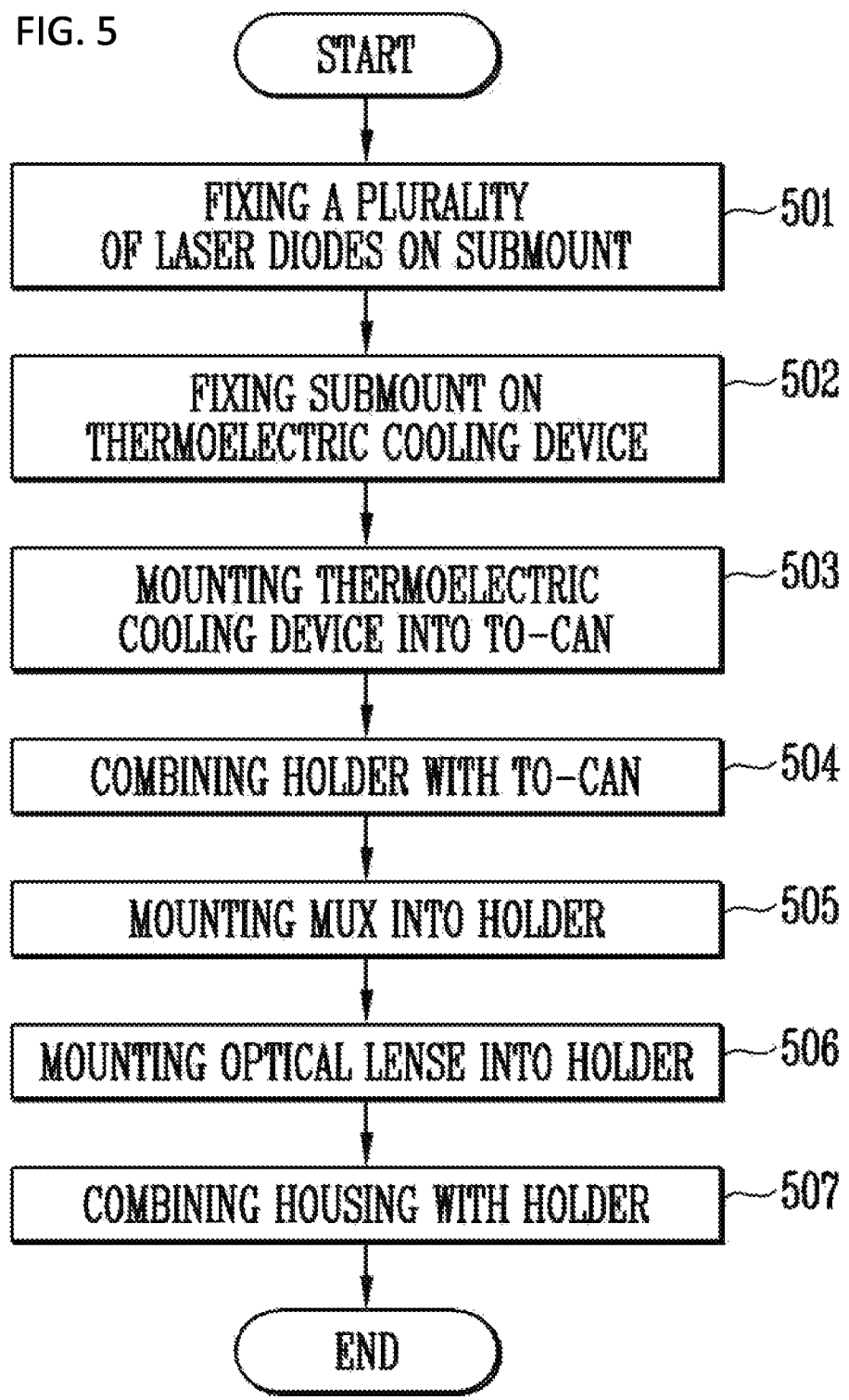

MULTI-CHANNEL OPTICAL MODULE AND MANUFACTURE METHOD THEREOF

CROSS-REFERENCE TO RELATED APPLICATION

The present application claims priority to Korean patent application number 10-2015-0154514, filed on Nov. 4, 2015, the entire disclosure of which is incorporated herein in its entirety by reference.

BACKGROUND

Field of Disclosure

Various embodiments of the present disclosure relate to a multi-channel optical module and a manufacture method thereof, and more particularly to, a multi-channel optical module to stabilize an output wavelength by stabilizing temperature of an optical module with a thermoelectric cooling device mounted in a TO-can.

Description of Related Art

Recently, a wavelength tunable light source of several tens of nanometers has been required in a physical quantity measuring system that uses light. Accordingly, in a conventional physical quantity measuring system, a method has been widely used, wherein the method enables a wavelength of output light to be linearly changed over time by sequentially modulating current flowing through a plurality of laser diodes (LD) with different center wavelengths. However, there should be limitations on the above method as the system increases in size.

Therefore, a structure has been required for increasing accuracy of physical quantity measurement by stabilizing the output wavelength caused by improving coupling efficiency between a light emitting device and optical fiber and stabilizing the temperature at the time of simplifying and miniaturizing an optical engine which is a key unit of the system.

In addition, as an amount of data transmitted by using optical communication increases in recent years, an optical communication system has been changed to a system using a multi-channel. Accordingly, a study for packaging technology for miniaturization of the optical module, which enables to concentrate a plurality of optical resources into a single optical fiber, has been actively conducted.

In the case of the optical module that supports a single mode, optical coupling efficiency between the devices is not high since a core of a fiber or a cross-section of the waveguide of the MUX combining the light source with a multi-wavelength has a size of several micrometers (um). In order to increase the optical coupling efficiency, various structures of the optical module and packing methods have been suggested. However, the structures of the optical module are complicated and the packaging requires a lot of time.

SUMMARY

Various embodiments of the present disclosure are directed a multi-channel optical module based on a TO-can that is applied to a physical measuring system or multi-channel optical communication, and more particularly to, a multi-channel optical module in a temperature stable type with a simple structure and an easy packaging process and a manufacturing method thereof.

According to the present disclosure, a multi-channel optical module may include a plurality of laser diodes emitting light with different wavelengths, a thermoelectric cooling device including the plurality of laser diodes, a TO-can including the thermoelectric cooling device, and a holder combined with the TO-can and including a plurality of optical lenses focusing the light with different wavelengths and a multiplexer gathering focused light into a single optical fiber, wherein the holder has a shape in which the TO-can is cut along an axis of a path of the light with different wavelengths for active alignment of the plurality of optical lenses.

In addition, according to the present disclosure, a method of manufacturing a multichannel optical module may include mounting a plurality of laser diodes emitting light with different wavelengths into a thermoelectric cooling device, mounting the thermoelectric cooling device into a TO-can, and combining a holder with the TO-can by fitting method (physical assembling, putting the pieces of the TO-can together), wherein the holder is configured to include a plurality of optical lenses focusing the light with the different wavelengths and a multiplexer concentrating focused light into a single optical fiber and has a shape cut along an axis of a path of light with different wavelengths.

BRIEF DESCRIPTION OF THE DRAWINGS

FIG. 5 is a flow chart illustrating a method of manufacturing a multi-channel optical module according to the present disclosure;

DETAILED DESCRIPTION

When the well-known functions and configurations in the following description of the embodiments of the present disclosure distract the subject matter of the present disclosure, the detailed description thereof may be omitted.

It will be understood that when an device or layer is referred to as being "on," "connected to," or "combined with" another device or layer, it can be directly on, connected to, or combined with the other device or layer, or one or more intervening devices or layers may be present. In addition, it will also be understood that when an device or layer is referred to as being "between" two devices or layers, it can be the only device or layer between the two devices or layers, or one or more intervening devices or layers may also be present.

The terminology used herein is for the purpose of describing particular embodiments only and is not intended to be limiting of the disclosure. It will be further understood that the terms "includes" and/or "including", when used in this specification, specify the presence of stated features, integers, steps, operations, devices, and/or components, but do not preclude the presence or addition of one or more other features, integers, steps, operations, devices, components, and/or groups thereof.

Furthermore, a singular form may include a plural from as long as it is not specifically mentioned in a sentence Hereinafter, embodiments will be described in greater detail with reference to the accompanying drawings.

Figure 1:
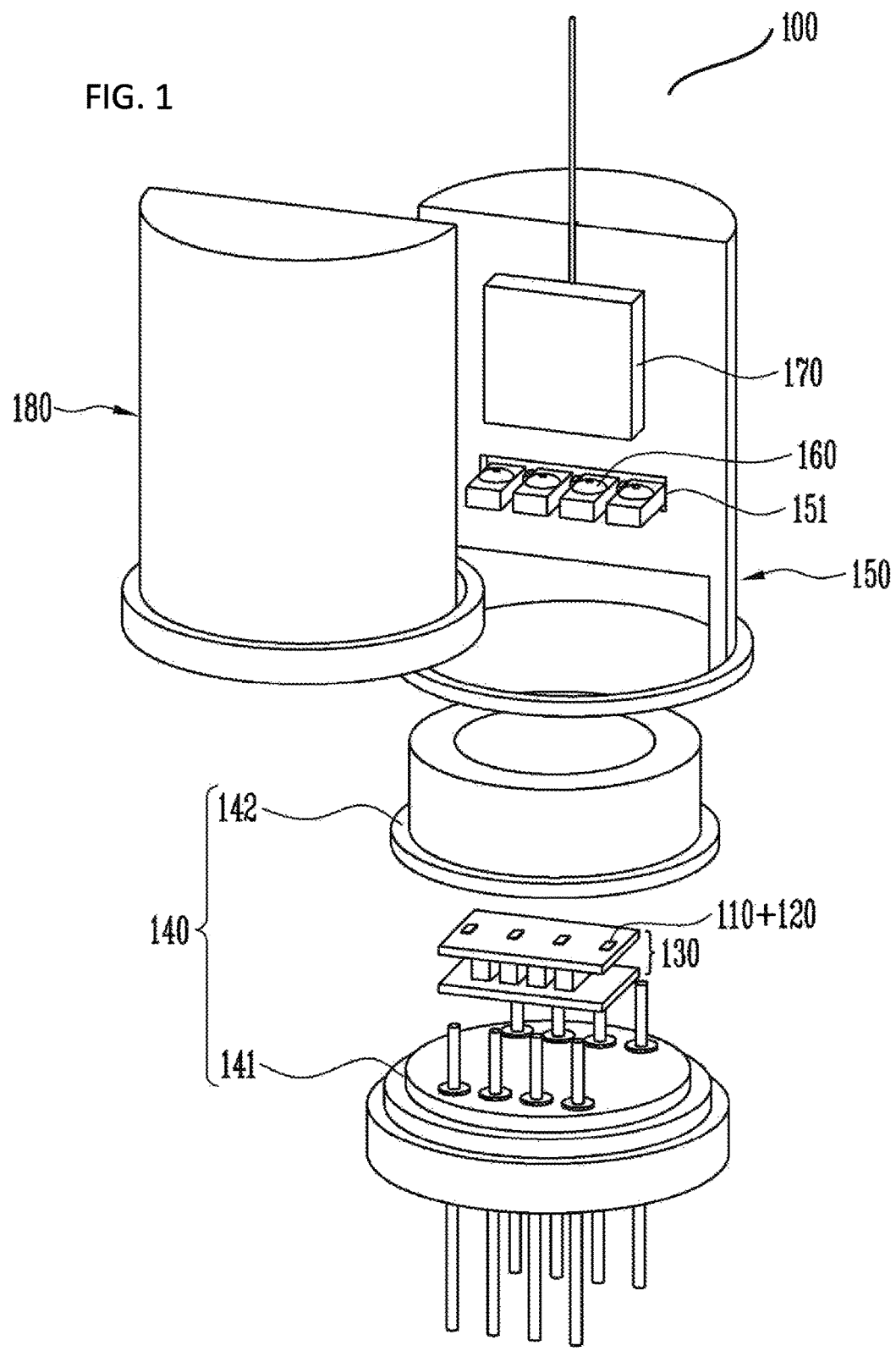
FIG. 1 is a diagram illustrating a structure a multi-channel optical module according to the present disclosure.

FIG. 1 is a diagram illustrating a structure of a multi-channel optical module according to the present disclosure.

Referring to FIG. 1, a multi-channel optical module 100 according to the present disclosure may include a plurality of laser diodes 110 mounted on a sub-mount 120, a thermoelectric cooling device 130, a TO-can 140, a holder 150, a multiplexer (MUX) 170 and a housing 180.

The plurality of laser diodes 110 may be light sources that output (emit) light with different wavelengths (λ1, λ2, λ3, . . . , and λn), respectively. The plurality of laser diodes 110 may be mounted on the sub-mount 120 so that power may be applied to electrodes of the laser diode chips.

In various embodiments of the present disclosure, the plurality of laser diodes 110 may be fixed on the sub-mount 120 in a row. To this end, an indicator for passively aligning the plurality of laser diodes 110 at accurate positions may be included on the sub-mount 120. The plurality of laser diodes 110 may be arranged in a row on the sub-mount 120 by the indicator marked on the sub-mount 120.

The plurality of laser diodes 110 to be aligned may be in fixed on the sub-mount 120 by flip-chip bonding. In various embodiments, the plurality of laser diodes 110 may be bonded to a single sub-mount 120, or individually bonded to the plurality of the sub-mounts corresponding to the plurality of laser diodes 110, respectively. Bonding material for fixing the plurality of laser diodes 110 may be epoxy or solder.

In various embodiments of the present disclosure, the plurality of laser diodes 110 may be arranged on the thermoelectric cooling device 130 and metalized with Au-pattern, thereby being directly mounted on the thermoelectric cooling device 130. In this case, the multi-channel optical module 100 may be implemented without the sub-mount 120. When implementing the multi-channel optical module 100 without the sub-mount 120, it has the advantages that performance of heat emission of the multi-channel optical module 100 is improved and a packaging process is reduced by one step with respect to a manufacturing method.

The thermoelectric cooling device 130 may include the TO-can 140 and a TO-stem 141 including devices constituting the multi-channel optical module 100, thereby stabilizing temperature of the multi-channel optical module 100.

According to an embodiment of the present disclosure, the sub-mount 120 including the plurality of laser diodes 110 may be fixed on the thermoelectric cooling device 130 by the flip-chip bonding. In another embodiment of the present disclosure, the plurality of laser diodes 110 may be directly metallized on the thermoelectric cooling device 130 as described above.

The thermoelectric cooling device 130 may be mounted in the TO-can 140. In more detail, the thermoelectric cooling device 130 may be fixed on the TO-stem 141 constituting the TO-can 140 and covered with a TO-cap 142.

In more detail, the thermoelectric cooling device 130 may be passively arranged on the TO-stem 141. To this end, at least one alignment mark may be aligned on the TO-stem 141 so that the thermoelectric cooling device 130 may be passively aligned at the accurate position. At least one alignment mark may be marked on the TO-stem 141 with the laser and formed in various types. The thermoelectric cooling device 130 may be bonded to the alignment mark shown on the TO-stem 141 to be passively aligned.

The thermoelectric cooling device 130 passively aligned may be bonded to the TO-stem 141. The thermoelectric cooling device 130 may be fixed on the TO-stem 141 by epoxy bonding.

The TO-stem 141 including the thermoelectric cooling device 130 may be covered with the TO-cap 142 to prevent the devices combined with the thermoelectric cooling device 130 (the plurality of laser diodes 110 or the sub-mount 120 bonded to the plurality of laser diodes 110) from the external environment. The TO-cap 142 may be bonded to the TO-stem 141 by an electric resistance welding machine after being combined with the TO-stem 141.

The TO-cap 142 may include a plate type anti-reflective coating window at a surface that emits the light (an upper surface of FIG. 1) to transmit the light output from the plurality of laser diodes 110, which are the light sources.

In various embodiments of the present disclosure, the TO-can 140 may have a cylindrical shape by combination of the TO-stem 141 and the TO-cap 142 as shown in FIG. 1.

The holder 150 may be combined with the TO-can 140. The holder 150 may include an optical lens 160 focusing the light output from the plurality of laser diodes 110 and the mux 170 in a PLC (planer light-wave circuit) type that focuses the light with the multi-wavelength having passed through the optical lens 160 into single optical fiber. The optical lens 160 and the MUX 170 may be output from the plurality of laser diodes 110 and properly aligned with the light transmitted through the TO-cap 142 for optical coupling. To this end, the holder 150 may include the MUX 170 at a predetermined position for the optical coupling and be combined with the TO-can 140 by the passive alignment. Further, the optical lens 160 may be mounted on the holder 150 combined with the TO-can 140. In various embodiments of the present disclosure, the holder 150 may be coupled or fixed to the TO-can 140 to minimize the error caused by the passive alignment of the devices.

Although the holder 150 is combined with the TO-can 140 by the fitting method and the devices are passively aligned, due to an error that occurs at bonding positions of the devices mounted on the TO-stem 141, optimal optical coupling between the devices mounted on the TO-stem 141 and the devices mounted in the holder 150 may not be achieved. According to the embodiment of the present disclosure, to overcome limitations of such passive alignment, the optical lens 160 may be mounted in the holder 150 by the active alignment. For the active alignment of the optical lens 160, a tool for adjusting the position of the optical lens 160, for example, a clamper, may be used.

Figure 2:
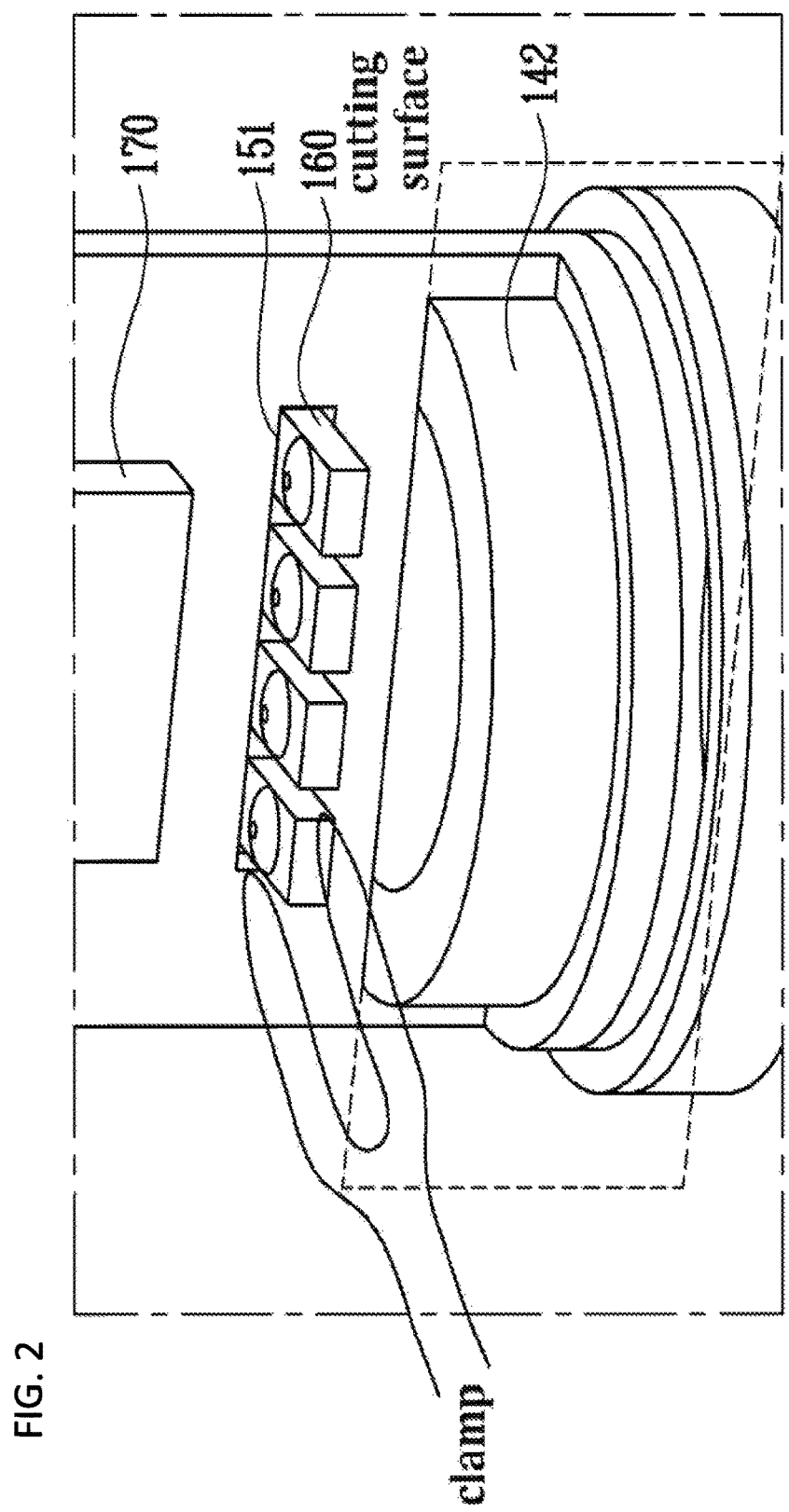
FIG. 2 is a diagram illustrating a detailed structure of a lens holder in a multi-channel optical module according to the present disclosure.

In various embodiments of the present disclosure, the holder 150 may have a shape in which the TO-can 140 is cut along the optical axis (light path axis). When the TO-can 140 has the cylindrical shape as shown in FIG. 1, the holder 150 may have a semi-cylindrical shape as shown in FIG. 2.

An optical lens mounting unit 151 including the optical lens 160 may be provided on a cutting surface of the holder 150. The optical lens mounting unit 151 may be provided in a groove shape on the cutting surface, such that the optical lens 160 may be inserted into a groove. When the plurality of optical lenses 160 are mounted in the holder 150, the optical lens mounting unit 151 may be formed in a single groove in size that includes the plurality of optical lenses 160 or respective ones of the grooves corresponding to the plurality of optical lenses 160.

The optical lens 160 may be actively aligned in the optical lens mounting unit 151 as described above. In this case, the holder 150 may have a shape where the TO-can 140 is cut along an optical axis, and a space for using a tool such as a clamper, for active alignment of the optical lens 160 may be achieved.

Figure 3:
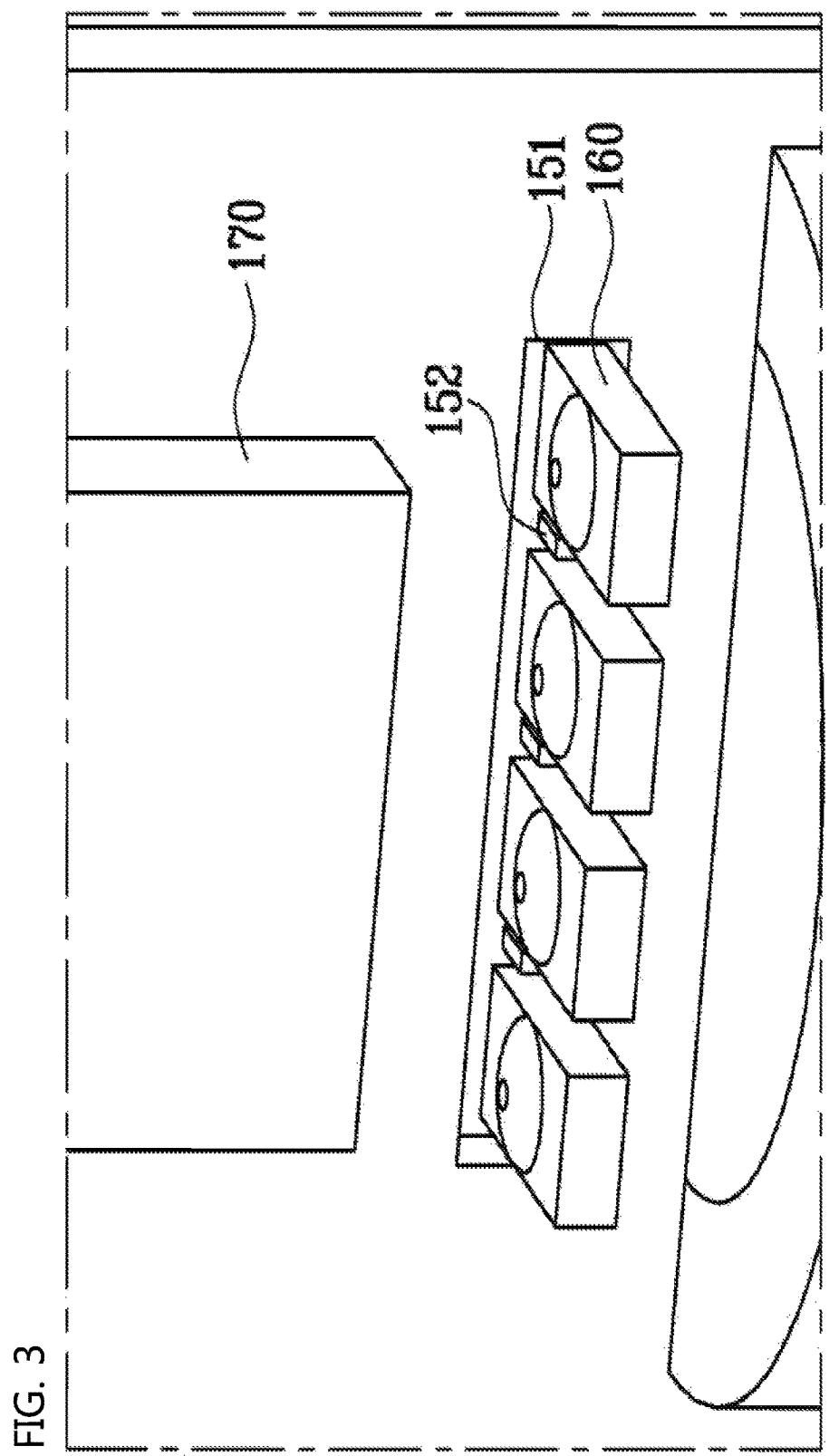
FIG. 3 is a diagram illustrating a detailed structure of an epoxy flow protecting unit in a multi-channel optical module according to the present disclosure.

The optical lens 160 actively aligned may be bonded with the epoxy. In various embodiments of the present disclosure, when the plurality of optical lenses 160 are bonded to the optical lens mounting unit 151 consisting of a single groove, in order to prevent the epoxy from flowing through the other optical lens 160 adjacent to one another, the optical lens mounting unit 151 may be provided with a protecting unit 152 as shown in FIG. 3.

At the top of the optical lens mounting unit 151, the MUX 170 may be mounted at a predesigned position based on the optical axis (an optical path), and bonded with the epoxy. To this end, the holder 150 may be provided with a mounting unit in the groove shape to include the MUX 170.

In the manufacturing of the multi-channel optical module 100 according to the present disclosure, after mounting the mux 170 into the holder 150, the holder 150 including the MUX 170 may be combined with the TO-can 140. Alternatively, after combining the holder 150 with the TO-can 140, the MUX 170 may be mounted on the holder 150. When the holder 150 and the mux 170 are combined with the TO-can 140, the optical lens 160 may be mounted in the holder 150.

For mounting the optical lens 160, according to the present disclosure, after arranging a light detector for detecting light power at the end of an optical fiber connected to the MUX 170, the optical lens 160 may be actively aligned at the position where light power detected from the light detector when the laser diode 110 is turned on, that is, the light power output from the multi-channel optical module 100 is maximum. In more detail, according to the present disclosure, after respective optical lens 160 is inserted into the optical lens mounting unit 151 to correspond to respective laser diode 110, the optical lens 160 may be accurately aligned at the position where the optical power is detected at the maximum and fixed by the epoxy bonding. Subsequently, according to the present disclosure, the optical lens 160 may be fixed on the optical lens mounting unit 151 by repeating the above process with respect to the plurality of optical lenses 160.

After the optical lens 160 is mounted in the holder 150, the housing 180 is bonded to the holder 150. The housing 180 may protect devices mounted in the holder 150 from the external environment.

A shape of the housing 180 may be in a variety of types, and the shape is not limited thereto. In FIG. 2, the housing 180 having a semi-cylindrical shape corresponding to the holder 150 is exemplified.

An output unit of the housing 180 may have various shapes, for example, a pigtailed fiber shape, FC/APC, FC/PC, etc. However, the output unit of the housing 180 is not limited a specific shape.

Figure 4:
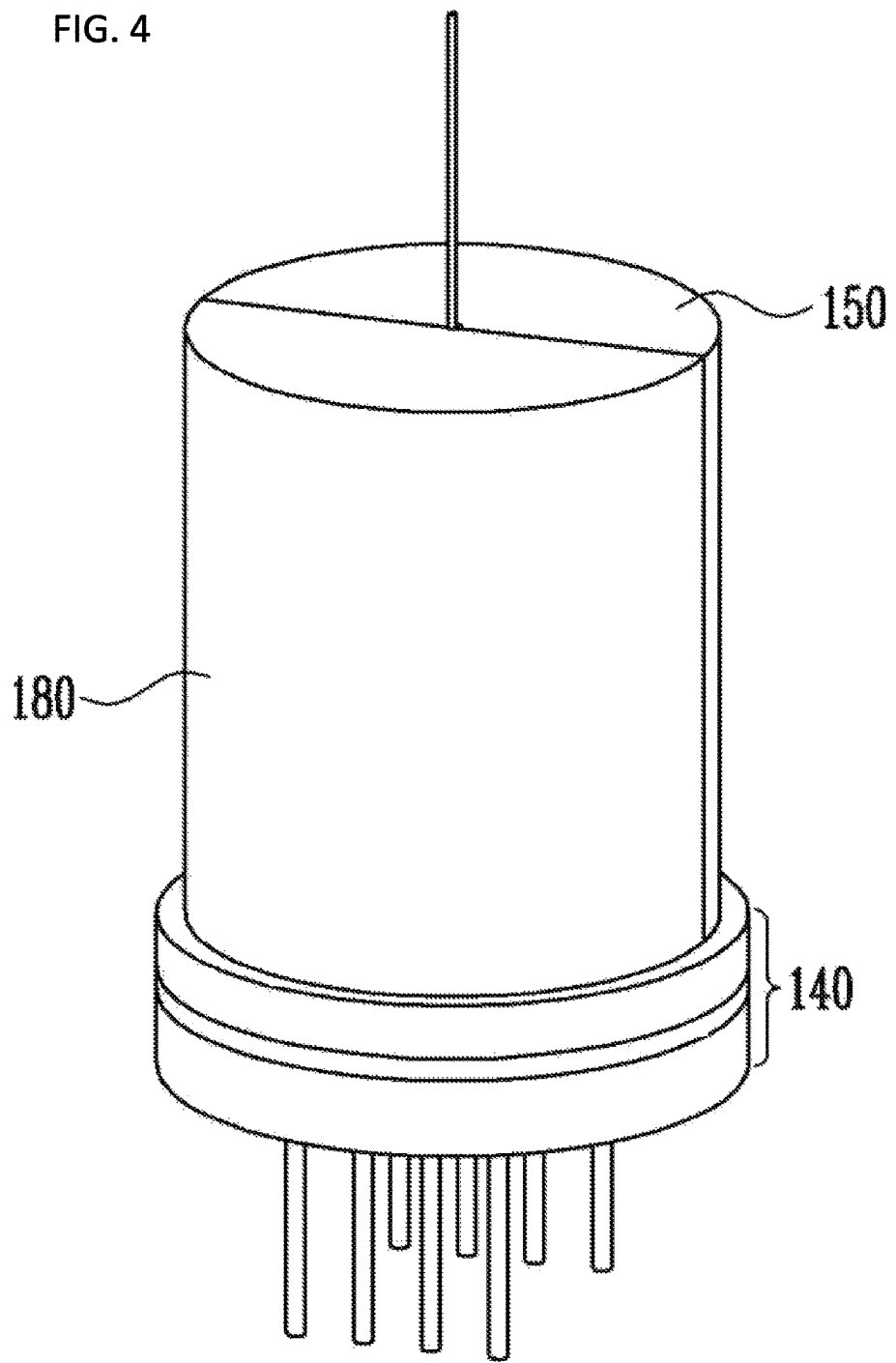
FIG. 4 is diagram illustrating a packaged multi-channel optical module according to the present disclosure.

In the embodiment, the multi-channel optical module 100 done with the final packaging up to the housing 180 may have the shape as shown in FIG. 4.

In the specification, the present disclosure has been described based on the TO-can 140 in the cylindrical shape. However, the present disclosure may be applied to the multichannel optical module 100 in various types, such as a flat shape. In addition, in the specification, the present disclosure has been described based on the multi-channel optical module 100 to which the vertical cavity surface emitting laser diode 110 is applied, but the present disclosure is not limited thereto. The present disclosure may be applied to the multi-channel optical module using the laser diode that emits beam horizontally. In this case, a filter may be additionally added to the TO-can 140 such that a path of light emitted from the laser diode 110 may be changed in a direction of a window of the TO-cap 142.

FIG. 5 is a flow chart illustrating a manufacturing method of a multi-channel optical module according to the present disclosure Referring to FIG. 5, according to the present disclosure, the plurality of the laser diodes 110 may be fixed on the sub-mount 120 (501). The plurality of laser diodes 110 may be passively aligned on the sub-mount 120 by using an indicator displayed on the sub-mount 120 and fixed by the flip chip bonding. The flip-chip bonding may be performed by using the epoxy.

In various embodiments of the present disclosure, when the plurality of laser diodes 110 are directly metallized on the thermoelectric cooling device 130, the above process may be omitted.

Subsequently, according to the present disclosure, the sub-mount 120 may be fixed on the thermoelectric cooling device 130 (502). The sub-mount 120 may be fixed on the thermoelectric cooling device 130 by the flip chip bonding.

In various embodiments of the present disclosure, when implementing the multichannel optical module 100 rather than using the sub-mount 120, the above process may be replaced with a process of directly metalizing the plurality of laser diodes 110 on the thermoelectric cooling device 130. The plurality of laser diodes 110 may be metalized in the Au-pattern.

Subsequently, according to the present disclosure, the thermoelectric cooling device 130 may be mounted in the TO-can 140 (503). In more detail, according to the present disclosure, the thermoelectric cooling device 130 may be passively aligned on the TO-stem 141 by using at least one alignment mark arranged on the TO-stem 141 to be bonded with the epoxy. Subsequently, the thermoelectric cooling device 130 may be covered with the TO-cap 142 combined with the TO-stem 141 with an electric resistance welding machine to be shielded from external environment.

In the various embodiments of the present disclosure, the TO-can 140 may have the cylindrical shape.

Subsequently, according to the present disclosure, the holder 150 may be combined with the TO-can 140 (504). The holder 150 may be combined with the TO-can 140 by the fitting method.

Subsequently, according to the present disclosure, the mux 170 may be mounted in the holder 150 (505). In the embodiment of the present disclosure, the MUX 170 may be mounted in the holder 150 before the holder 150 is combined with the TO-can 140 and the holder 150 including the mux 170 may be combined with the TO-can 140. The MUX 170 may be mounted at a position designed for the optical axis of light transmitted to the MUX 170 through the optical lens 160.

According to the various embodiments of the present disclosure, the holder 150 may have the shape in which the TO-can 140 is cut along the optical axis. In the embodiment, the holder 150 may have a semi-cylindrical shape.

Subsequently, according to the present disclosure, the optical lens 160 may be mounted on the holder 150 (506).

The optical lens 160 may be actively aligned on the optical lens mounting unit 151 formed in the groove shape at a cutting surface of the holder 150 and bonded with the epoxy. Lastly, according to the present disclosure, the holder 150 may be combined with the housing 180.

According to the present disclosure, an optical module structure may be applied to a module for multi-channel optical communication in addition to an optical engine unit of a physical quantity measuring system.

Further, according to the present invention, an optical module structure based on a TO-can including a thermoelectric cooling device may enable to stabilize a wavelength of light that is output through the temperature stabilization.

In addition, according to the present disclosure, a structure and a method of packaging a small optical module are provided, which improves optical coupling efficiency with an easy process by actively and passively aligning devices constituting an optical module.

In the drawings and specification, there have been disclosed typical exemplary embodiments of the disclosure, and although specific terms are employed, they are used in a generic and descriptive sense only and not for purposes of limitation. As for the scope of the disclosure, it is to be set forth in the following claims. Therefore, it will be understood by those of ordinary skill in the art that various changes in form and details may be made therein without departing from the spirit and scope of the present disclosure as defined by the following claims.

What is claimed is:

1. A multi-channel optical module, comprising:
    a plurality of laser diodes emitting lights with different wavelengths, respectively;
    a thermoelectric cooling device including the plurality of laser diodes;
    a TO-can having a first shape and including the thermoelectric cooling device; and
    a holder combined with the TO-can and including a plurality of optical lenses focusing the lights with the different wavelengths and a multiplexer gathering the focused lights into a single optical fiber,
    wherein the holder has a second shape in which the first shape is cut along optical axes of optical paths of the lights with the different wavelengths for active alignment of the plurality of optical lenses.

2. The multi-channel optical module according to claim 1, wherein the holder further comprises an optical lens mounting unit consisting of at least one groove formed in a surface of the holder so that the plurality of optical lenses are inserted thereto,
    wherein the plurality of optical lenses are inserted into the optical lens mounting unit and actively aligned to be fixed at corresponding positions in which light power output from the multi-channel optical module is maximum.

3. The multi-channel optical module according to claim 2, wherein the holder comprises a plurality of protecting units arranged in the optical lens mounting unit so that bonding material does not flow through adjacent optical lens when the plurality of optical lenses are fixed at the optical lens mounting unit consisting of a single groove.

4. The multi-channel optical module according to claim 1, wherein the TO-can has a cylindrical shape and the holder has a semi-cylindrical shape in which the TO-can is cut along the optical axes of the optical paths of the lights with the different wavelengths.

5. The multi-channel optical module according to claim 1, wherein the plurality of laser diodes are mounted on a single sub-mount or a plurality of sub-mounts, respectively.

6. The multi-channel optical module according to claim 3, wherein the plurality of laser diodes are passively aligned on a single sub-mount or a plurality of sub-mounts by using an indicator marked on the single sub-mount or the plurality of sub-mounts and fixed by flip-chip bonding with epoxy or solder.

7. The multi-channel optical module according to claim 1, wherein the plurality of laser diodes are metalized with Au-pattern on the thermoelectric cooling device.

8. The multi-channel optical module according to claim 1, wherein the TO-can comprises:
    a TO-stem at which at least one aligning mark for passive alignment of the thermoelectric cooling device is formed and the thermoelectric cooling device aligned by using the at least one aligning mark is fixed; and
    a TO-cap combined with the TO-stem to shield the thermoelectric cooling device from an external source and including a window in which the lights with the different wavelengths are transmitted.

9. The multi-channel optical module according to claim 1, further comprising
    a housing combined with the holder to shield the plurality of optical lenses mounted in the holder and the multiplexer from an external source.

10. A method of manufacturing a multichannel optical module, the method comprising:
    mounting a plurality of laser diodes emitting lights with different wavelengths, respectively, into a thermoelectric cooling device;
    mounting the thermoelectric cooling device into a TO-can having a first shape; and
    combining a holder with the TO-can by a fitting method,
    wherein the holder is configured to include a plurality of optical lenses focusing the lights with the different wavelengths and a multiplexer concentrating the focused lights into a single optical fiber, and
    wherein the holder has a second shape in which the first shape is cut along optical axes of optical paths of the lights with the different wavelengths.

11. The method according to claim 10, further comprising:
    actively aligning the plurality of optical lenses in a plurality of optical lens mounting units formed in a surface of the holder to have maximum light power output from the multi-channel optical module; and
    bonding the plurality of optical lenses actively aligned with the plurality of optical lens mounting units.

12. The method according to claim 10, wherein the mounting of the plurality of laser diodes into the thermoelectric cooling device comprises:
    passively aligning the plurality of laser diodes into a single sub-mount by using an indicator marked on the single sub-mount;
    bonding the plurality of laser diodes passively aligned with the single sub-mount; and
    bonding the single sub-mount with the thermoelectric cooling device.

13. The method according to claim 10, wherein the mounting of the plurality of laser diodes into the thermoelectric cooling device comprises:
    passively aligning the plurality of laser diodes to corresponding sub-mounts, respectively, by using an indicator marked on each of the corresponding sub-mounts;
    bonding the plurality of laser diodes with the corresponding sub-mounts, respectively; and
    bonding the corresponding sub-mounts with the thermoelectric cooling device.

14. The method according to claim 10, wherein the mounting of the plurality of laser diodes into the thermoelectric cooling device comprises metalizing the plurality of laser diodes on the thermoelectric cooling device with Au-pattern.

15. The method according to claim 10, wherein the mounting of the thermoelectric cooling device into the TO-can comprises:
- passively aligning the thermoelectric cooling device on a TO-stem by using at least one aligning mark formed on the TO-stem;
- bonding the thermoelectric cooling device passively aligned with the TO-stem; and
- combining a TO-cap for shielding the thermoelectric cooling device from an external source with the TO-stem.

16. The method according to claim 10, wherein the combining of the holder with the TO-can by the fitting method further comprises:
- mounting the multiplexer into the holder; and
- combining the holder including the multiplexer with the TO-can by the fitting method.

17. The method according to claim 10, further comprising mounting the multiplexer into the holder after combining the holder with the TO-can by the fitting method.

18. The method according to claim 10, further comprising mounting the plurality of optical lenses in an optical lens mounting unit having a groove shape formed in a surface of the holder after combining the holder with the TO-can by the fitting method.

19. The method according to claim 10, further comprising combining a housing shielding the plurality of optical lenses mounted in the holder and the multiplexer from an external source with the holder.

\* \* \* \* \*